United States Patent
Kurihara et al.

(10) Patent No.: US 7,367,000 B2
(45) Date of Patent: Apr. 29, 2008

(54) METHOD FOR SIMULATING POWER VOLTAGE DISTRIBUTION OF SEMICONDUCTOR INTEGRATED CIRCUIT AND SIMULATION PROGRAM

(75) Inventors: Takashi Kurihara, Kasugai (JP); Kenji Wada, Kasugai (JP); Masahiro Suzuki, Kasugai (JP); Eiji Fujine, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 350 days.

(21) Appl. No.: 11/305,184

(22) Filed: Dec. 19, 2005

(65) Prior Publication Data

US 2007/0044047 A1 Feb. 22, 2007

(30) Foreign Application Priority Data

Aug. 17, 2005 (JP) ............... 2005-236621

(51) Int. Cl.
*G06F 17/50* (2006.01)
(52) U.S. Cl. .......................... 716/4; 703/14
(58) Field of Classification Search ................ 716/4, 716/8; 703/14
See application file for complete search history.

(56) References Cited

U.S. PATENT DOCUMENTS

| | | | |
|---|---|---|---|
| 6,854,094 B2 * | 2/2005 | Inui et al. ........................ | 716/2 |
| 2003/0110461 A1 * | 6/2003 | Inui et al. ....................... | 716/5 |
| 2003/0237059 A1 * | 12/2003 | Schultz ........................... | 716/4 |
| 2004/0031008 A1 * | 2/2004 | Satoh et al. ..................... | 716/8 |
| 2004/0073878 A1 * | 4/2004 | Hasegawa et al. .............. | 716/8 |
| 2005/0050502 A1 * | 3/2005 | Kurihara et al. ............... | 716/10 |
| 2005/0076316 A1 * | 4/2005 | Pierrat et al. ................... | 716/4 |
| 2005/0197816 A1 * | 9/2005 | Inukai et al. ................... | 703/14 |
| 2006/0026540 A1 * | 2/2006 | Bhooshan et al. .............. | 716/4 |
| 2006/0184904 A1 * | 8/2006 | Murgai et al. .................. | 716/4 |

FOREIGN PATENT DOCUMENTS

| | | |
|---|---|---|
| JP | 2003-233637 | 8/2003 |
| JP | 2004-234618 | 8/2004 |

* cited by examiner

*Primary Examiner*—Stacy A Whitmore
(74) *Attorney, Agent, or Firm*—Staas & Halsey LLP

(57) ABSTRACT

The invention has an object to provide a method for simulating power voltage distribution of a semiconductor integrated circuit, by which it is possible to attempt to shorten the time required for preparing a power unit model and it is possible to carry out a highly accurate simulation with uneven distribution of a floor plan taken into account. In Step S1, design information (Core size CS, core ring width CW, block shape BS, macro shape MS, block current BI, macro current MI, etc.) is inputted into a simulator. In Step S2, information regarding a floor plan (Block position BP, macro position MP, power I/O position IOP) is inputted into the simulator by a designer. In Step S3, the power unit management table is initialized, and resistance modeling and current source modeling are also carried out. In Step S5 (FIG. 1), the static IR drop is calculated based on the power unit management table CT obtained in Step S4.

10 Claims, 12 Drawing Sheets

FLOWCHART OF STATIC IR DROP SIMULATION ACCORDING TO EMBODIMENT 1

VIEW DEPICTING LAYOUT AREA LA

VIEW DEPICTING MODEL OF POWER UNIT PU ACCORDING TO EMBODIMENT 1

ARRANGEMENT VIEW OF BLOCKS AND MACROS IN CORE AREA CA
(BEFORE ADJUSTMENT)

FLOWCHART DEPICTING RESISTANCE MODELING IN STEP S12 (PART 1)

FLOWCHART OF RESISTANCE MODELING IN STEP S12 (PART 2)

VIEW DEPICTING THE FIRST WIRING LAYER MET1 IN POWER UNIT PU

VIEW DISPLAYING RESULTS OF IR DROP ANALYSIS CORRESPONDING TO FIG. 4

ARRANGEMENT VIEW OF BLOCKS AND MACROS IN CORE AREA CA
(AFTER ADJUSTMENT)

VIEW DISPLAYING RESULTS OF IR DROP ANALYSIS CORRESPONDING TO FIG. 10

VIEW DEPICTING MODEL OF POWER UNIT ACCORDING TO EMBODIMENT 2

METHOD FOR SIMULATING POWER VOLTAGE DISTRIBUTION OF SEMICONDUCTOR INTEGRATED CIRCUIT AND SIMULATION PROGRAM

CROSS-REFERENCE TO RELATED APPLICATIONS

This application is based upon and claims the benefit of priority from the prior Japanese Patent Application No. 2005-236621 filed on Aug. 17, 2005, the entire contents of which are incorporated herein by reference.

BACKGROUND OF THE INVENTION

1. Field of the Invention

The present invention relates to a method for simulating a power distribution of a semiconductor integrated circuit, and a simulation program. In particular, the invention relates to a method for simulation in connection with initial estimation of power voltage drop, and a simulation program therefor.

2. Description of Related Art

Recently, in line with miniaturization in LSI development, large scaling of incorporated gate sizes and complexity thereof have been advanced, wherein such a problem arises that the period of development is lengthened. Therefore, in an attempt to shorten the period of development, in the stage of initial estimation before commencing the design, it becomes necessary to examine the power specifications by which power voltage drop is accommodated within a permissible range.

In Japanese Unexamined Patent Application Publication No. 2003-233637, a power wiring area of a semiconductor integrated circuit is divided into small areas of a so-called power unit, and a resistance value and a consumption current value of the power units are given, wherein a static voltage drop (static IR drop) is simulated by a constant consumption current value. Also, in Japanese Unexamined Patent Application Publication No. 2004-234618 as well, a resistance value, a consumption current value, an inductance value, and a capacitance value are given to the power units, wherein a dynamic power voltage distribution (dynamic IR drop) is simulated.

SUMMARY OF THE INVENTION

In the above-described prior arts, it is necessary for a designer to calculate various types of parameters such as a resistance value, a consumption current value, an inductance value, a capacitance value, etc., and to input the same into a simulator. However, if calculations are carried out for all of the power units since there are a number of power units, there is a problem in that a great deal of time is required for simulation.

Also, since it is not realistic to calculate parameters with respect to a number of power units, it is considered that a simulation is carried out with the number of power units reduced. However, in this case, it is impossible to obtain a voltage distribution result having sufficient accuracy, wherein there is a problem of a lowering in reliability of the simulation result. Furthermore, in the prior art, there is a problem in that any detailed method for calculating various types of parameters of the power units is not disclosed.

The present invention was developed to solve at least one problem of the background art described above, and it is therefore an object of the invention to provide a method for simulating a power voltage distribution of a semiconductor integrated circuit and a simulation program, which, by attempting to shorten the time required for preparing a power unit model, increases efficiency of the IR drop simulation and attempts to shorten the period of development of semiconductor integrated circuits, and is capable of carrying out a highly accurate simulation in which unevenness in floor plans (uneven distribution of various types of parameters in layout areas of various types of circuits) is taken into consideration by handling a greater number of power units.

In order to achieve the above objective, in a first thought according to the invention, a method for simulating a power voltage distribution comprises the steps of: dividing a layout area of a semiconductor integrated circuit into a plurality of division units and acquiring power occupancy ratio information that expresses a power wiring density in the division units; acquiring power I/O position information, which expresses at least one position to which power is fed in the layout area; obtaining a resistance value of a model resistor, which expresses the resistance value of power wiring between the division units adjacent to each other, in response to a predetermined sheet resistance value of the power wiring and the power occupancy ratio information; and defining a division unit at least a part of which overlaps a predetermined area disposed by at least one so that the predetermined area occupies at least a part of the layout area as a division unit belonging to the predetermined area, and uniformly allotting a consumption current consumed in the predetermined area to the division units belonging to the predetermined area.

In the power voltage distribution of a semiconductor integrated circuit, there is a static voltage drop (static IR drop) due to a constant consumption current value, and a chronological dynamic power voltage distribution (power noise), etc. The layout area of a semiconductor integrated circuit includes areas such as a core area in which circuits pertaining to main actions are disposed, a core ring area in which power wiring (core ring) provided annularly in the surrounding of the core area is disposed, and a power I/O area in which a power I/O cell being a cell for feeding power is disposed. As the circuits pertaining to main actions, circuits expressed in terms of hard macro such as a block of a hierarchical layout, RAM and ROM, etc., may be listed.

Division units are respective areas obtained by dividing a layout area into a plurality of areas. The shape of a division unit is made polygonal, for example, triangular, square, hexagonal, etc. The respective division units may be divided into a uniform size or the division units of an area in which a voltage distribution is simulated in detail may be divided to be small, and the division units of an area in which a voltage distribution is roughly simulated may be divided to be large.

Information regarding a power occupancy ratio is information expressing the power wiring density in the division units. There are various types of expression methods in regard to the wiring density. For example, where it is defined that the wiring width and wiring interval of power wiring compose one unit, the area ratio at which the corresponding one unit occupies the division unit may be regarded as the power occupancy ratio information, or the area ratio at which the power wiring occupies the division unit may be regarded as the power occupancy ratio information.

The power I/O position information is information expressing the position of power I/O cells. At least one or more power I/O cells are provided. The positions of the power I/O cells are parameters that directly pertain to a voltage distribution.

A model resistor is provided for respective sides of division units, which is a resistor expressing a resistance value of power wiring between adjacent division units described above. For example, if the division units are square, four model resistors are provided for the respective sides. At this time, it may be considered that the four resistors are commonly connected to be like a cross-shape at the center of the division unit. A sheet resistance value of the power wiring is predetermined in compliance with a technology. The resistance value which the division unit has is determined on the basis of the area of the division unit and the power wiring density based on the power occupancy ratio information. The obtained resistance value of the division unit is allotted to respective model resistors wherein a resistance value of the model resistor can be obtained.

A predetermined area is at least one area disposed so that it occupies at least a part of the layout area. The predetermined area may be single or plural. For example, the predetermined area may be the entire layout area or may be an area occupied by a block of a hierarchical layout, or may be an area occupied by a hard macro such as a RAM and ROM, etc. Also, a current of a predetermined amount is consumed in the predetermined area.

In a model in which a constant amount of a current flows on the entire semiconductor integrated circuit, the entirety of the layout area is made into the predetermined area. In this case, since it is sufficient that only one type of division unit is used, it is possible to shorten the model preparation time. Therefore, the entire period of time of simulation can be shortened. In addition, in a model in which a plurality of areas having different current values are provided in the layout area, the respective areas are made into the predetermined area. In this case, since it is possible to prepare a model for which uneven distribution (unevenness) of resistance values, etc., of the power wiring in the layout area is taken into account, further accurate voltage distribution can be simulated.

The division unit belonging to the predetermined area is a division unit at least a part of which overlaps the predetermined area. Therefore, only in a case where the entire area of the division unit overlaps the predetermined area, it may be considered that the division unit belongs to the predetermined area. Since it is assumed that the consumption current in the predetermined area is uniform, the consumption current in the predetermined area may be uniformly allotted to the division units belonging to the predetermined area. Accordingly, the consumption current value in the division units is determined.

If the resistance value of the model resistor, power feeding position and consumption current value in the division units are determined, a division unit model (of the prior art documents) for obtaining a power voltage distribution is completed. And, by connecting the respective division unit models to each other, a model of a semiconductor integrated circuit is obtained. A power voltage distribution of a semiconductor integrated circuit is obtained by calculation of a circuit equation obtained by using the model of a semiconductor integrated circuit.

Therefore, in a first thought according to the invention, it is not necessary to use parameters such as various types of resistance values and current values in preparation of a model of division units for a power voltage distribution simulation, and it is possible to use parameters (power occupancy ratio information, power I/O position information, sheet resistance value, etc.) of the upper-order concept in design with respect to the resistance value and current value. Accordingly, time and effort for obtaining the resistance values and current values can be saved when preparing a model of division units, wherein it is possible to attempt to shorten the time required for model preparation. Therefore, since high efficiency of the simulation is enabled, it is possible to attempt to shorten the period of development of a semiconductor integrated circuit. Also, by saving time and effort to give the resistance values and current values when preparing a model of division units, model preparation efficiency can be improved, wherein it becomes possible to prepare models of a greater number of division units for the same period of time as before. Thus, since the accuracy of a voltage drop simulation can be improved, it becomes possible to more accurately carry out initial estimation of IR drop.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Hereinafter, a detailed description is given of a semiconductor storage device of the invention and concrete embodiments of the semiconductor memory device with reference to the drawings based on FIG. 1 through FIG. 12. Embodiment 1 of the invention will be described below, using FIG. 1 through FIG. 11.

Embodiment 1 enables initial estimation and countermeasures of static voltage drop (static IR drop) by a constant consumption current value. Since the initial estimation is carried out at the beginning stage of design, product data such as a net list, etc., are not required.

Figure 2:
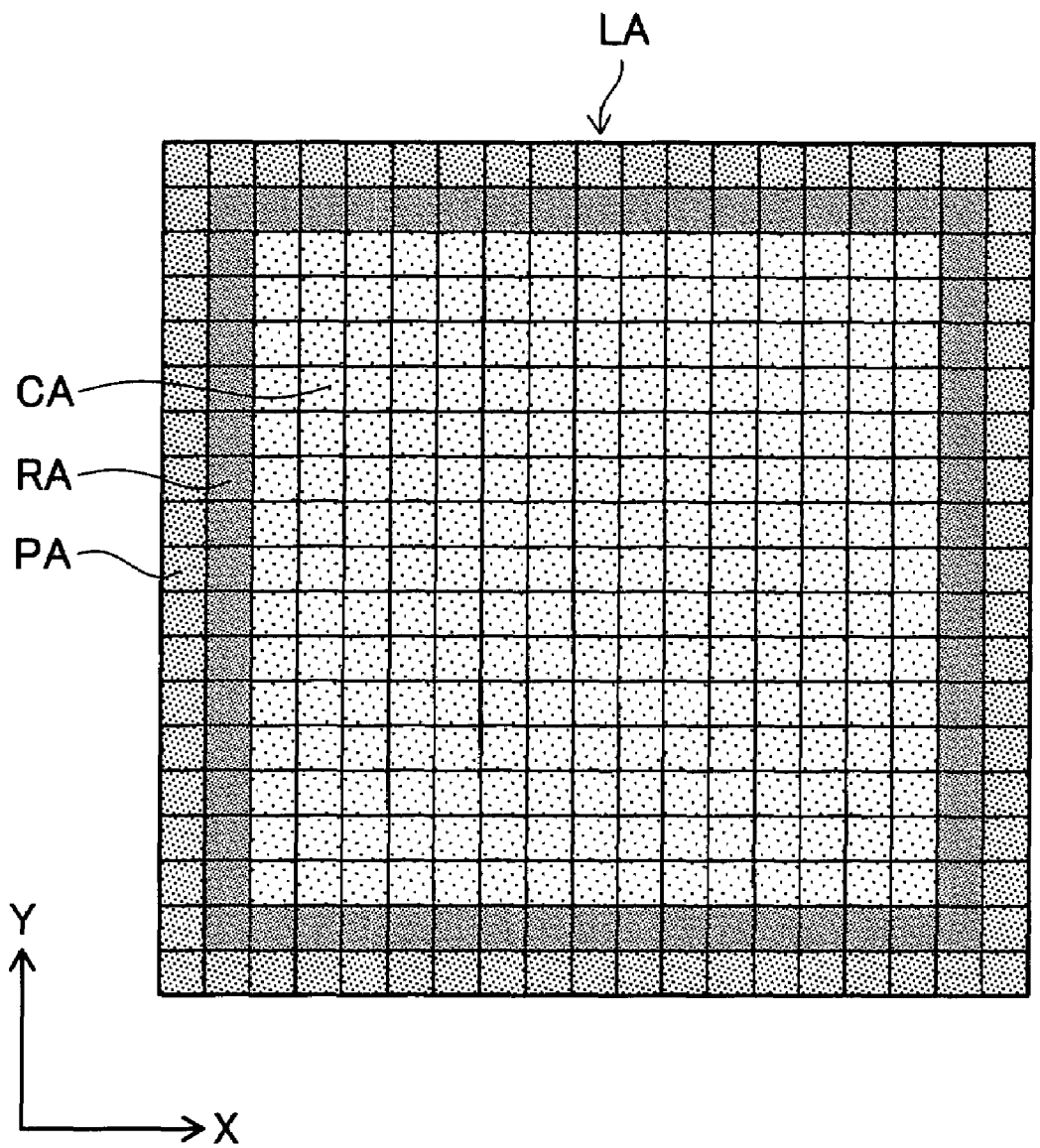
FIG. 2 is a view depicting the layout area LA.

A description is given of a model used for a static IR drop simulation of the invention. As depicted in FIG. 2, the entirety of the layout area LA of a semiconductor integrated circuit is divided into power units PU which are square and matrix-shaped small areas. And, the power units PU are divided into a core area CA, a core ring area RA, and a power I/O area PA. Herein, the core area CA is an area in which circuits (blocks and macros, etc., of a hierarchical layout) pertaining to main actions are disposed. Also, the core ring area RA is an area in which power wiring (core ring) provided annularly in the surrounding of the core area CA is disposed. In addition, the power I/O area PA is an area in which a plurality of power I/O cells being cells for feeding power to the core ring area RA are provided. The power I/O cell is connected to a peripheral power terminal of a semiconductor package via an electrode pad and wire bonding.

Figure 3:
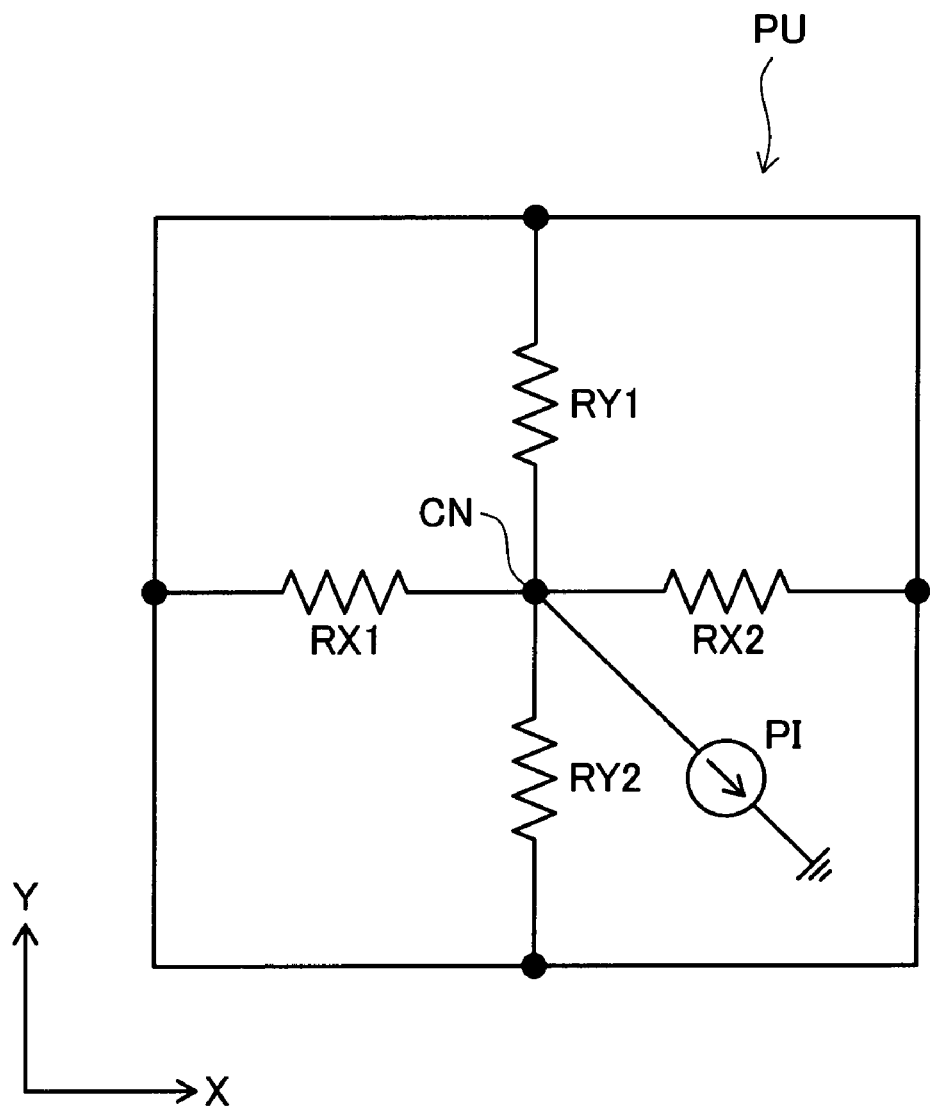
FIG. 3 is a model diagram depicting a power unit PU according to Embodiment 1.

FIG. 3 depicts a model of the power unit PU. By four model resistors RX1, RX2, RY1 and RY2 being provided at respective sides of a square-shaped power unit PU, the power wiring between adjacent power units PU is made into a model by a single resistance. The four resistors are commonly connected to each other to be like a cross-shape at the center node CN of the power unit PU. Also, all the consumption currents in the power unit PU are substituted by one current source PI. Accordingly, a two-dimensional cross-shaped circuit model is formed. Using this power unit PU, a static IR drop is calculated in Step S5 by the method described in, for example, Patent Document (Japanese Unexamined Patent Application Publication No. 2003-233637). Hereinafter, a description is given mainly of a flow of modeling of the resistance of power wiring and a flow of modeling the power unit current value PUI being the current value of the current source PI of the power unit PU.

Figure 1:
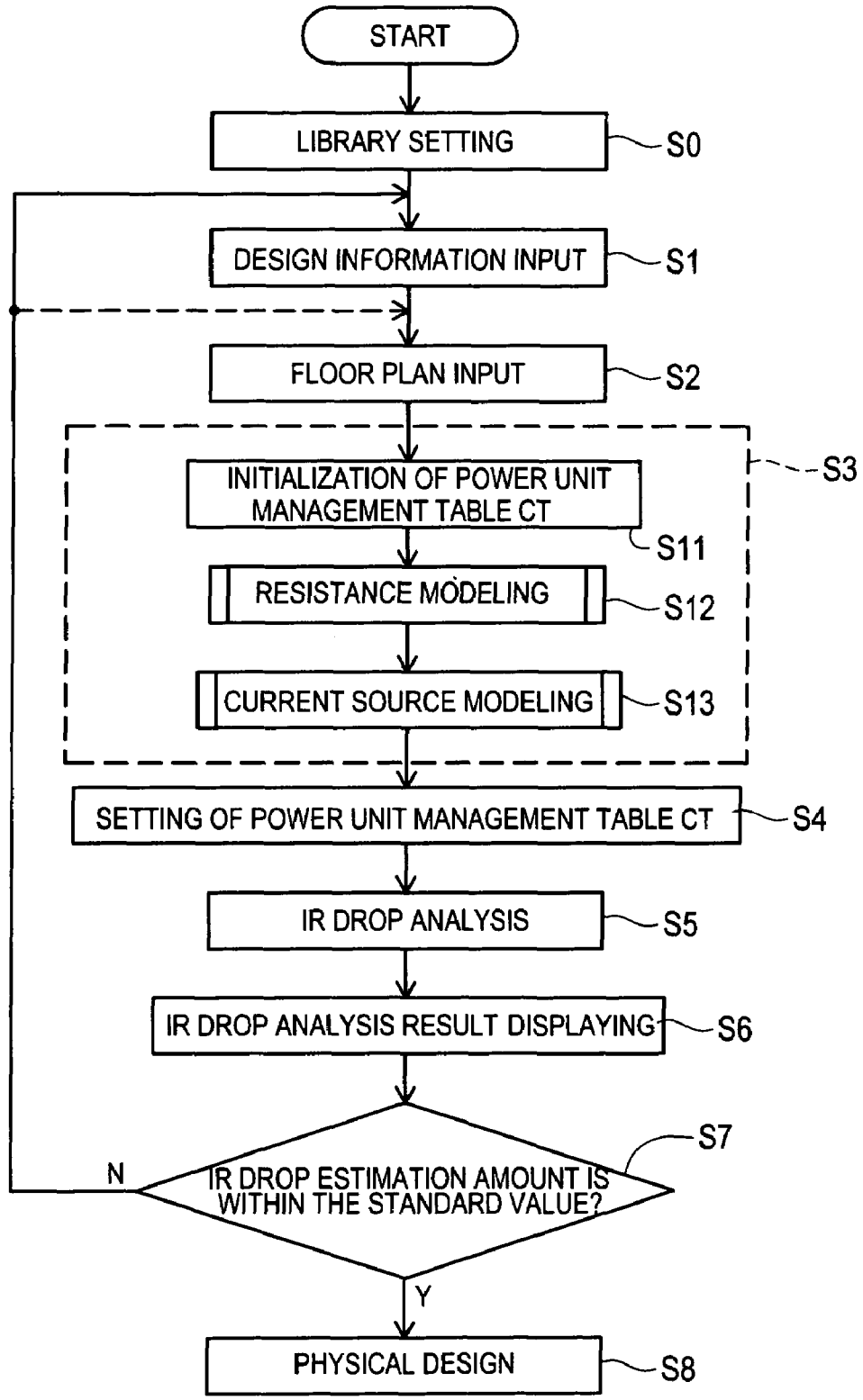
FIG. 1 is a flowchart depicting a static IR drop simulation according to Embodiment 1.

FIG. 1 is a flowchart depicting Embodiment 1. In library setting in Step S0, parameters responsive to a process technology are stored in advance in a library. It is assumed that the wiring layers of a semiconductor integrated circuit according to the present embodiment is four-layered, including the first wiring layer MET1 through the fourth wiring layer MET4. At this time, the sheet resistance value SR1 of the first wiring layer through the sheet resistance value SR4 of the fourth wiring layer, the wiring width W1 of the first wiring layer MET1 through the wiring width W4 of the fourth wiring layer MET4, and the between-wiring distance SP1 of the first wiring layer MET1 through the between-wiring distance SP4 of the fourth wiring layer MET4 are stored in the library. In addition, a power unit size US (power unit X-direction size PUX and power unit Y-direction size PUY), which expresses the size of the power unit PU, is stored in the library.

A description is given of Step S1. In Step S1, a designer inputs design information into a simulator and the information is stored in an information storage section DM (not illustrated). Herein, the design information includes (1) Core size CS, (2) Core ring width CW, (3) Block shape BS and Macro shape MS, (4) Block current BI and Macro current MI, (5) Chip total current CI, (6) Power I/O resistance value IOR, (7) Package resistance PR, and (8) Power occupancy ratio (On-block power occupancy ratio BPR, On-macro power occupancy ratio MPR, and Chip power occupancy ratio CPR).

The core size CS is a size (X,Y) occupied by the core area CA (FIG. 2), in which circuits pertaining to main actions are disposed, on the layout area LA. The core ring width CW is the wiring width of a core ring formed in the core ring area RA.

The block shape BS is the shape of a block, and the macro shape MS is the shape of a macro. The block and macro are disposed in the core area CA with these shapes. Herein, the block means a hierarchical block in which a hierarchical layout is carried out, and the macro means a hard macro such as a RAM, ROM, etc. There exist a plurality of blocks and macros.

The block current BI is a current amount consumed by a single block, and the macro current MI is a current amount consumed by a single macro. The block current BI and the macro current MI are values determined by the types of the block and macro. The chip total current CI is a current consumed by the entirety of a semiconductor chip, which is determined by the specification given by a customer.

The power I/O resistance value IOR is a resistance value which the power I/O cell section has. The package resistance PR is the total resistance of resistors existing in the channel from the power I/O cell to the peripheral terminal of a package. For example, this is expressed by combined resistance in which resistance of a lead wire of a package and resistance of wire bonding connected in series are combined.

The power occupancy ratio is information expressing the power wiring density of a wiring layer of the power unit PU, which is determined in respective power units PU. There is VDD wiring and VSS wiring in the power wiring. The power occupancy ratio is determined in compliance with the type of block and macro to which the power unit PU belongs, and is determined based on the relevant wiring layer. Where at least a part of the power unit PU overlaps the block, the on-block power occupancy ratio BPR is applied as the power occupancy ratio of the power unit PU. In addition, where at least a part of the power unit PU overlaps the macro, the on-macro power occupancy ratio MPR is applied as the power occupancy ratio of the power unit PU. Where the power unit PU does not overlap any of the block and macro, the chip power occupancy CPR is applied as the power occupancy ratio of the power unit PU. Also, where at least a part of the power unit PU overlaps both the block and macro, the macro has priority, and the on-macro power occupancy ratio MPR is applied as the power occupancy ratio of the power unit PU.

There exist various types of methods for expressing the power occupancy ratio. In the present embodiment, the ratio of signal wiring grids collapsed by the power is regarded as the power occupancy ratio. Also, it is a matter of course that the ratio of the area which the area of the power wiring occupies the power unit PU may be defined as the power occupancy ratio information.

A description is given of Step S2. In Step S2, a designer inputs information regarding the floor plan into a simulator, and the information is stored in an information storage section DM (not illustrated). Herein, the information regarding the floor plan includes (9) Block position BP/Macro position MP, and (10) Power I/O position IOP.

The block position BP is a coordinate at which the block occupies the core area CA. The macro position MP is a coordinate at which the macro occupies the core area CA. Also, the power I/O position IOP is a coordinate at which the power I/O cell occupies the power I/O area PA (FIG. 2) shown in FIG. 2. Further, any optional number of the power I/O cell may be disposed at an optional position of the power I/O area PA.

Figure 4:
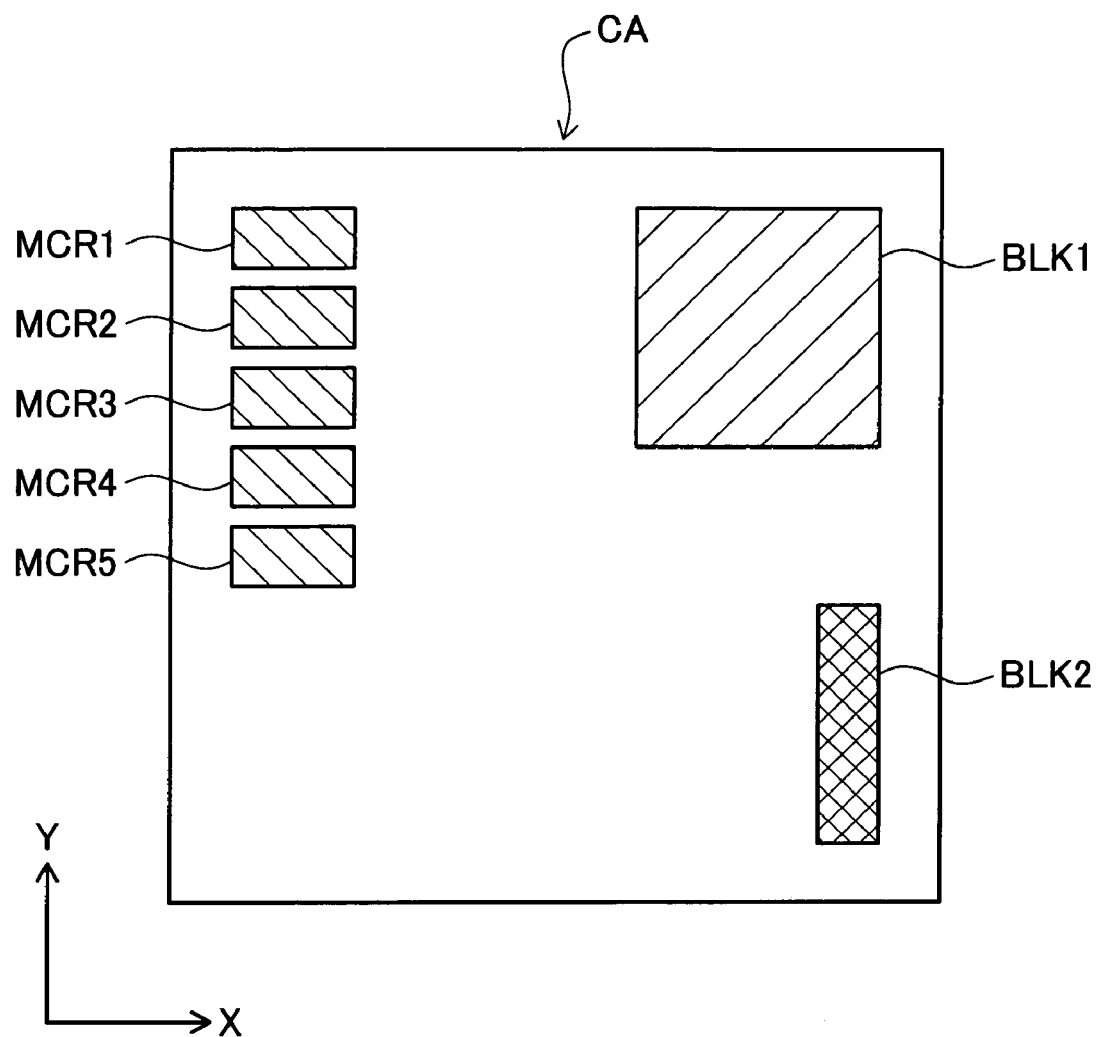
FIG. 4 is an arrangement view (before adjustment) of blocks and macro in the core area CA.

In Step S2, FIG. 4 depicts a floor plan example in which the blocks BLK1 and BLK2 and macros MCR1 through MCR5 are disposed in the core area CA. In Step S2, the designer operates to dispose the block and macro in the core area CA while observing a simulation screen shown in FIG. 4, and can input the coordinates of the block and macro. Therefore, there is an advantage that, while visually checking the floor plan, it is possible to input the coordinates of the block and macro, and possible to correct the floor plan while checking the screen. Furthermore, it is a matter of course that the coordinates can be inputted by using figures without any use of the screen display.

Step S3 (FIG. 1) will be described below. Step S3 is composed of Step S11 (Initialization of power unit management table), Step S12 (Resistance modeling), and Step S13 (Current source PI modeling).

The initialization of the power unit management table in Step S11 is composed of the following three steps. First, the core size CS is acquired from the information storage section DM. Next, the power unit size US is acquired from the library. And, the core area CA of a semiconductor integrated circuit is divided into power units PU, which are matrix-shaped small areas, in compliance with the core size CS and the power unit size US. For example, the core area CA is divided into 50 divisions in both the X direction and the Y direction where the core size CS is (X,Y)=(5000,5000 (µm)) and the power unit size US is (X,Y)=(100,100(µm)). Therefore, the core area CA is provided with 2500 power units PU. Also as in the above, the core ring area RA and the power I/O area PA are divided into power units PU. And, a power unit map PM shown in FIG. 2 is constructed. And a power unit management table CT for managing all the power units PU equipped in the core area CA is formed.

Figure 5:
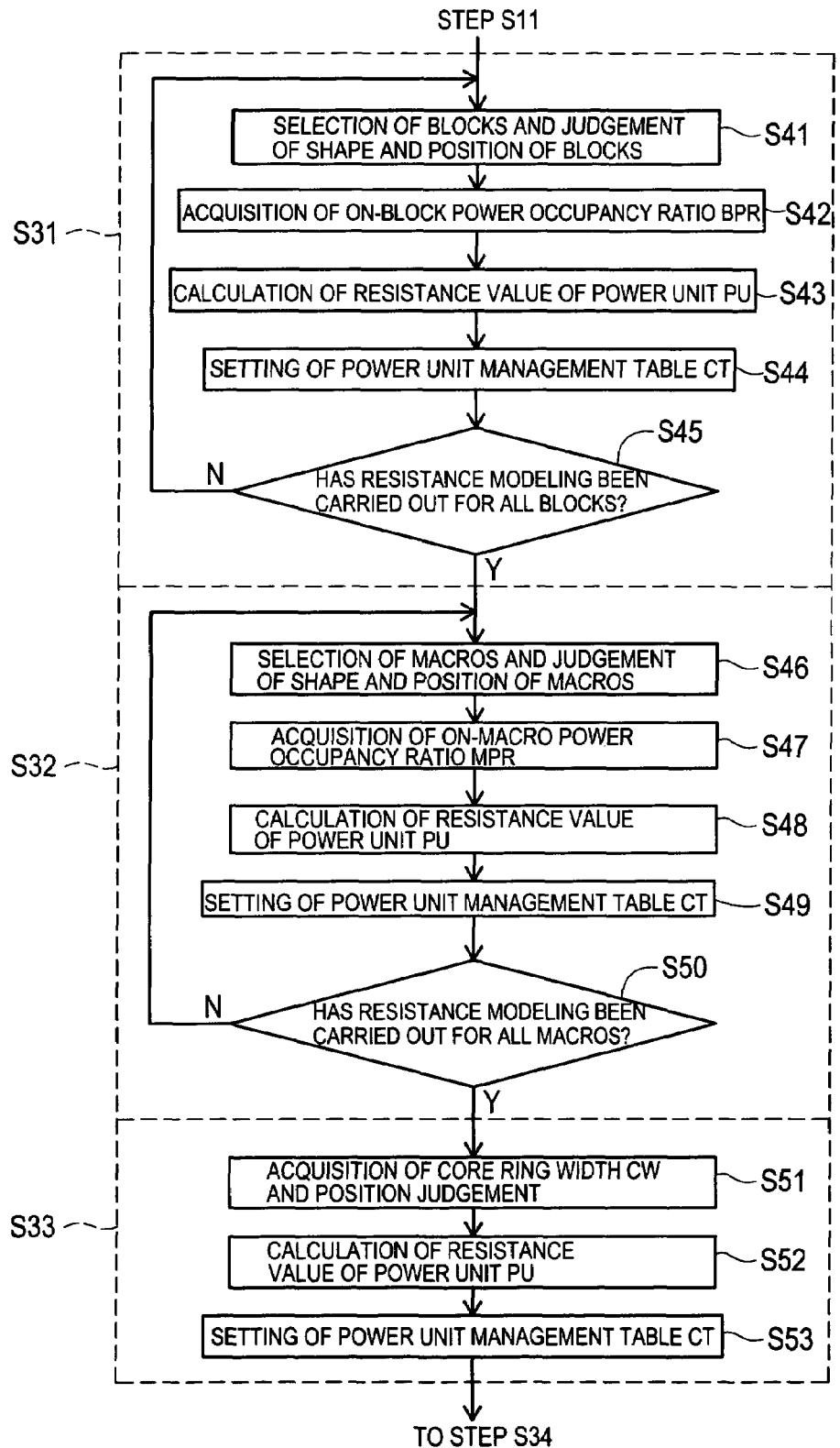
FIG. 5 is a flowchart depicting resistance modeling in Step S12 (Part 1)
Figure 6:
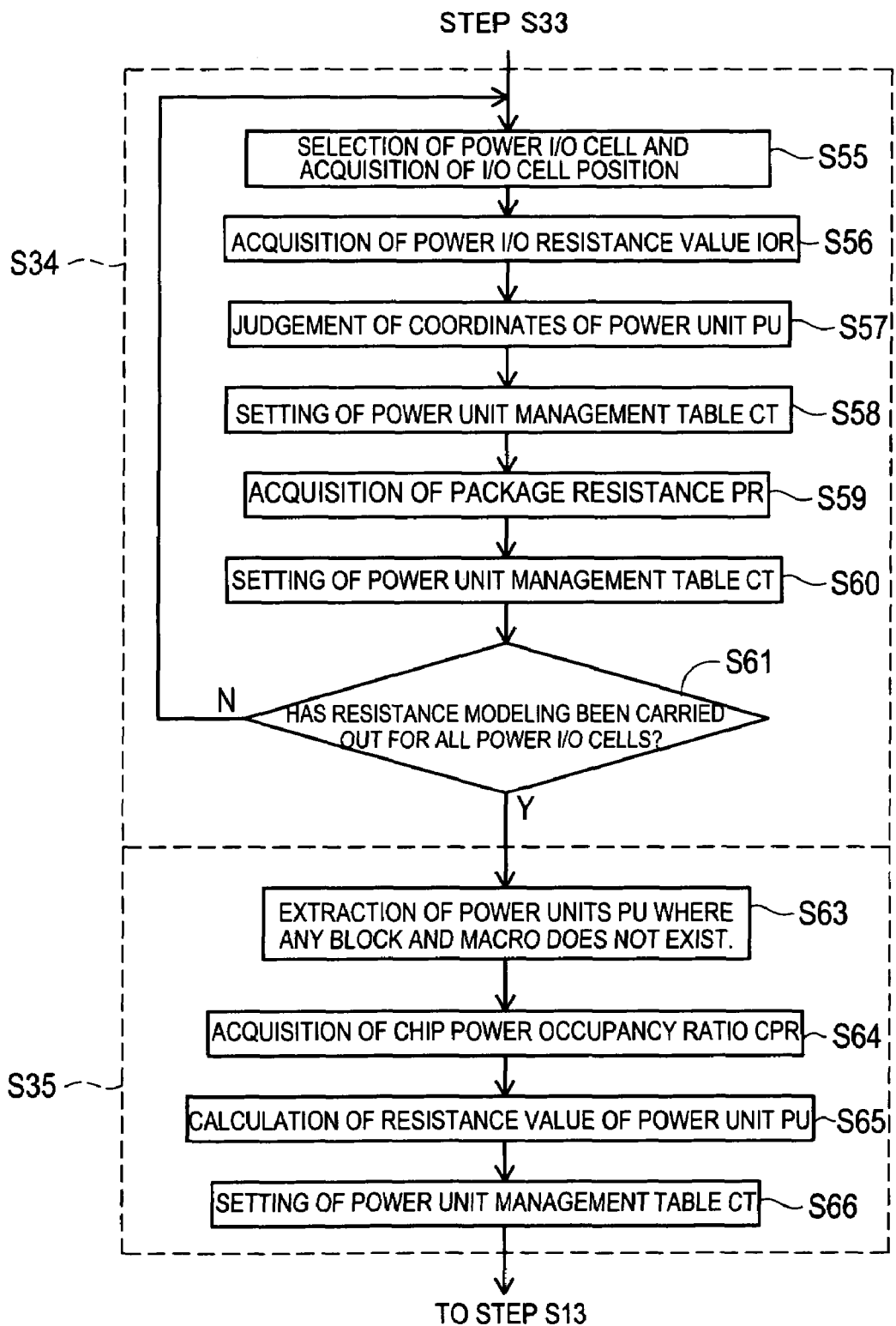
FIG. 6 is a flowchart depicting resistance modeling in Step S12 (Part 2)

The resistance modeling carried out in Step S12 is depicted in the flowcharts of FIG. 5 and FIG. 6. A description is given of a case where resistance modeling is carried out with respect to the floor plan depicted in FIG. 4. The resistance modeling is a process for obtaining the resistance values of respective resistors RX1, RX2, RY1 and RY2 in a cross model (FIG. 3) equipped in the power unit PU. The resistance modeling method in Step S12 is provided with Steps S31 through S35. The step S31 is a step for extracting a power unit PU overlapping the blocks BLK1 and BLK2 in the core area CA and for calculating the resistance value equipped in the extracted power unit PU. Step S32 is a step for extracting a power unit PU overlapping the macros MCR1 through MCR5 in the core area CA and for calculating the resistance value of the extracted power unit PU. Step S33 is a step for calculating the resistance value of the power unit PU existing in the core ring area RA. Step S34 is a step for calculating the resistance value of the power unit PU overlapping the power I/O cell in the power I/O area PA, and simultaneously for adding the package resistance PR to the calculated resistance value. Step S35 is a step for extracting the power unit PU, which does not overlap any of the block and macro in the core area CA, and for calculating the resistance value of the extracted power unit PU.

A description is given of Step S31. Step S31 is provided with Steps S41 through S45. Step S41 selects blocks and judges the shape and position thereof. By selection of blocks, all the blocks disposed in the core area CA are selected one after another. In the embodiment (FIG. 4), block BLK1 is selected first as an example. And, a power unit PU at least a part of which overlaps the block BLK1 is extracted with the shape and disposed position of the block BLK1 taken into consideration. The extracted power unit PU is identified as the power unit PU belonging to the block BLK1.

In Step S42, with respect to block BLK1, the respective on-block power occupancy ratios BPR1 through BPR4 of the first wiring layer MET1 through the fourth wiring layer MET4 are acquired from the information storage section DM.

In Step S43, the resistance values of the power units PU belonging to the block BLK1 are calculated. Since it is modeled that the resistance value in the block BLK1 is uniform, all the power units PU belonging to the block BLK1 have the same resistance values. Therefore, calculation is executed with respect to one representative power unit PU. Herein, it is assumed that, in regard to the first wiring layer MET1 through the fourth writing layer MET4, wiring is routed in the Y direction in the first wiring layer and the third wiring layer, and wiring is routed in the X direction in the second wiring layer and the fourth wiring layer. Therefore, the resistance values for the respective layers are calculated by using the on-block power occupancy ratios BPR1 through BPR4 corresponding to each of the first wiring layer MET1 through the fourth wiring layer MET4, wherein it is necessary that the resistance values in the same direction are regarded as parallel resistances, and are added to each other to make these values into one value.

Figure 7:
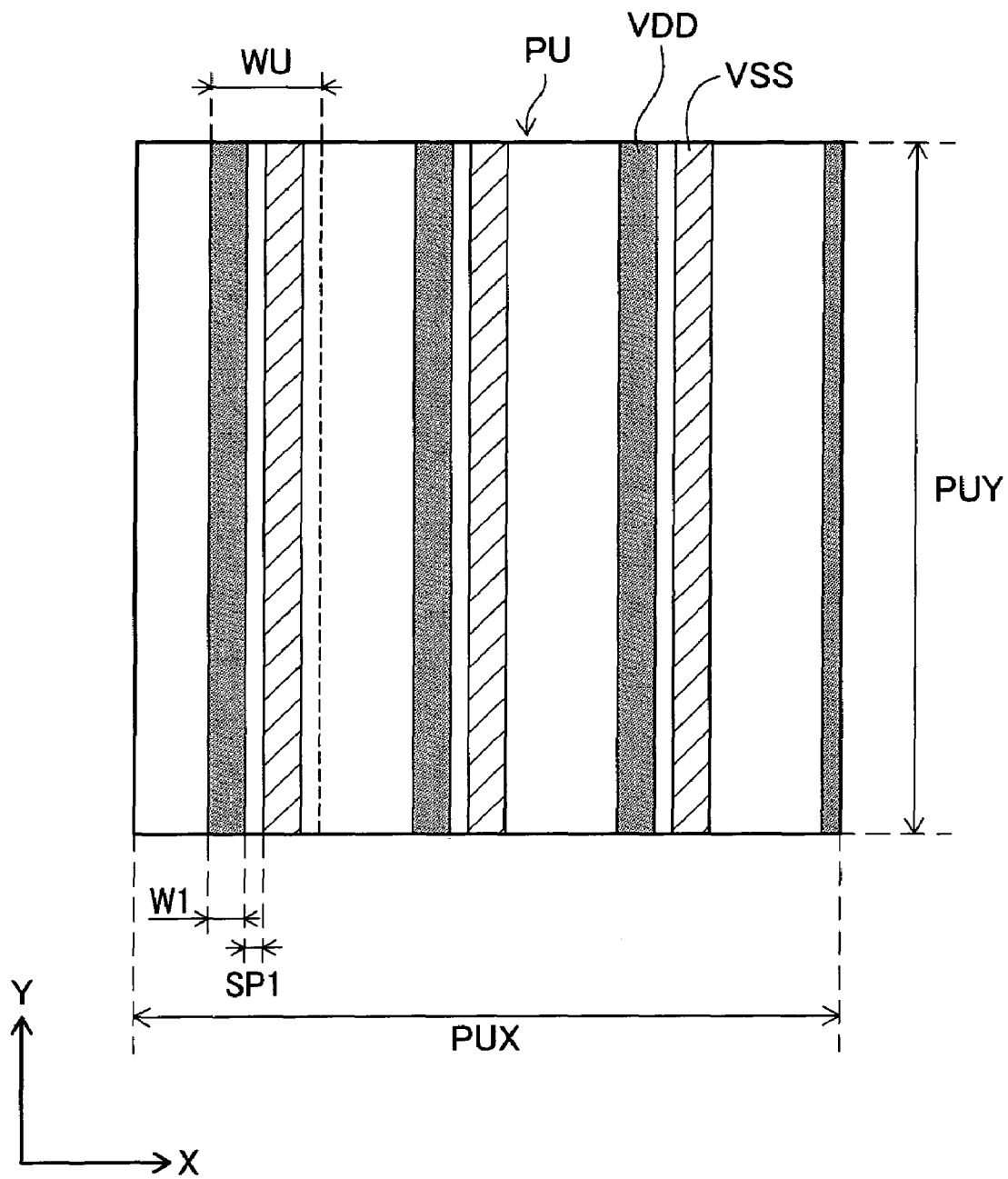
FIG. 7 is a view depicting a first wiring layer MET1 in the power unit PU.

As an example, a description is given of a method for obtaining the resistance value R1 of the first wiring layer MET1 (in the Y direction) in the power unit PU belonging to the block BLK1, using FIG. 7. In the power unit PU of FIG. 7, there is VDD wiring and VSS wiring. The wiring width of the VDD wiring and VSS wiring is wiring width W1. Also, a distance SP1 between wiring is secured between the wiring. In addition, the minimum wiring unit WU is composed of a pair of VDD wiring and VSS wiring.

Minimum wiring unit $WU$=(Wiring width $W1$+Distance $SP1$ between wiring)×2     Expression (0)

Further, the minimum wiring units WU are equidistantly disposed in the power unit PU.

A description is given of a case where the resistance value of the VDD wiring is obtained. First, the number N1 of wiring of the VDD wiring, which exist in the power unit PU in the first wiring layer MET1 is obtained by the following expression.

Number $N1$ of wiring=(On-block power occupancy ratio $BPR1$(%)/100×Power unit $X$ direction size $PUX$/Minimum wiring unit $WU$     Expression (1)

Next, the resistance value R1 is calculated from the number N1 of wiring.

Resistance value $R1$=Sheet resistance value $SR1$× Power unit $Y$ direction size $PUY$/(Wiring width $W1$×Number $N1$ of wiring)     Expression (2)

Thereby, the resistance value R1 of the first wiring layer MET1 is obtained.

Similarly, the resistance value R2 of the second wiring layer MET2 (X direction), the resistance value R3 of the third wiring layer MET3 (Y direction), and the resistance value R4 of the fourth wiring layer MET4 (X direction) are obtained. And, the resistances in the same direction of multilayered wiring are regarded as parallel resistances, and the parallel resistances are merged into one value, wherein the X direction resistance component RX and the Y direction resistance component RY are obtained.

$X$ direction resistance component $RX$=1/(1/$R2$+1/$R4$) Expression (3)

$Y$ direction resistance component $RY$=1/(1/$R1$+1/$R3$) Expression (4)

And, the resistance values of resistors RX1, RX2, RY1 and RY2 in the cross model depicted in FIG. 3 are obtained. At this time, the resistance value RX1=RX2=(X direction resistance component RX/2) is established. Also, similarly, the resistance value RY1=RY2=(Y direction resistance component RY/2) is established. And, since the obtained resistance values are given to all the power units PU belonging to the block BLK1, resistance modeling of the power unit PU belonging to the BLK1 is completed.

In Step S44 (FIG. 5), the resistance values of the resistors RX1, RX2, RY1 and RY2 with respect to all the power units PU belonging to the block BLK1 are stored in the power unit management table CT and managed therein.

After that, the process advances to Step S45, it is determined whether or not resistance modeling is carried out for all the blocks in the core area CA. In the present embodiment, since resistance modeling has not been carried out for the block BLK2 (S45:N), the process returns to Step S41, wherein resistance modeling is carried out with respect to the block BLK2. By the flow being repeated, the resistance modeling is carried out (S45:Y) for all the blocks in the core area, and then the process advances to Step S32.

Step S32 is described below. Step S32 is provided with Steps S46 through S50. In Step S46, a macro is selected, and the shape and position of the macro are judged. By selection of the macro, all the macros disposed in the core area CA are selected one after another. In the present embodiment (FIG. 4), as an example, macro MCR1 is selected first, and a power unit PU at least a part of which overlaps the macro MCR1 is extracted. In Step S47, with respect to the macro MCR1, the respective on-macro power occupancy ratios MPR1 through MPR4 of the first wiring layer MET1 through the fourth wiring layer MET4 are acquired from the information storage section DM. In Step S48, resistance modeling is carried out for all the power units PU belonging to the macro MCR1. In Step S49, the resistance values of the resistors RX1, RX2, RY1 and RY2 of all the power units PU belonging to the macro MCR1 are stored in the power unit management table CT and managed therein. In Step S50, it is judged whether or not resistance modeling is carried out for all the macros in the core area CA, wherein if resistance modeling is finished for all the macros (S50:Y), the process advances to Step S33. Also, since the detailed resistance modeling method is similar to the resistance modeling method for the blocks (Step S41 through S45), the description thereof is omitted.

Since there are cases where macros are included in blocks, there are cases where at least a part of a specified power unit PU overlaps both a block and a macro. However, in this case, priority is placed on the macro. That is, a power unit PU that overlaps both a block and a macro is judged that it does not belong to the corresponding block in Step S41, and it is judged to belong to the macro in Step S46.

Step S33 is described below. Step S33 is provided with Steps S51 through S53. In Step S51, the core ring width CW is acquired from the information storage section DM. And, a power unit PU at least a part of which overlaps the core ring is extracted.

In Step S52, the resistance value of the power unit PU belonging to the core ring is calculated.

A description is given of a method for obtaining the core ring resistance value CR1 in the first wiring layer MET1 as an example. The resistance value of the core ring disposed in the X direction is obtained by the following expression (5), and the resistance value of the core ring disposed in the Y direction is obtained by the following expression (6).

The resistance value $CRX1$ of the core ring in the $X$ direction=Sheet resistance value $SR1$/Core ring width $CW$×Power unit $X$ direction size $PUX$    Expression (5).

The resistance value $CRY1$ of the core ring in the $Y$ direction=Sheet resistance value $SR1$/Core ring width $CW$×Power unit $Y$ direction size $PUY$    Expression (6).

Similarly, the resistance values of the core rings in the second wiring layer MET2 through the fourth wiring layer MET4 are obtained. The resistance values of the core rings in the respective wiring layers are regarded as parallel resistances, and are merged into one value. Therefore, the core ring resistance value CR is thus obtained. And, in Step S53, the core ring resistance values CR for all the power units PU belonging to the core ring are stored in the power unit management table CT and managed therein. Accordingly, resistance modeling for the core ring is finished, and the process advances to Step S34.

Step S34 (FIG. 6) is described below. Step S34 is provided with Steps S55 through S61. In Step S55, the power I/O cells disposed in the power I/O area PA are selected one after another. And, the position coordinates of the selected power I/O cell are acquired from the information storage section DM. In Step S56, the power I/O resistance value IOR of the selected power I/O cell is acquired from the information storage section DM.

In Step S57, the coordinates of the power unit PU at least a part of which overlaps the selected power I/O cell are judged and extracted by using the coordinates of the corresponding power I/O cell. And, the resistance value of the power unit PU belonging to the corresponding power I/O cell is obtained from the power I/O resistance value IOR. Herein, the power unit PU belonging to the power I/O cell for feeding power to the side having the Y direction component of the core ring is provided with resistors RX1 and RX2. Also, the power unit PU belonging to the power I/O cell for feeding power to the side having the X direction component of the core ring is provided with resistors RY1 and RY2. In Step S58, the resistance values RX1 and RX2 (or RY1 and RY2) for the power unit PU belonging to the corresponding power I/O cell are stored in the power unit management table CT and managed therein.

In Step S59, package resistance PR corresponding to the selected power I/O cell is acquired from the information storage section DM. In Step S60, the package resistance PR acquired in Step S59 is added to the resistance values RX1 and RX2 (or RY1 and Ry2) for the power unit PU belonging to the power I/O cell, and these are reset in the power unit management table, wherein it becomes possible to form power units PU with the package resistance PR taken into consideration.

After that, the process advances to Step S61, and it is judged whether or not resistance modeling is carried out with respect to all the power I/O cells in the power I/O area PA. And, if resistance modeling is carried out for all the power I/O cells (S61:Y), the process advances to Step S35. Also, at this time, the resistance value of a power unit PU in the power I/O area PA, which does not belong to any of the power I/O cells, is regarded to be infinite.

Step S35 is described below. Step S35 is provided with Steps S63 through S66. In Step S63, a power unit PU not belonging to any one of the blocks and macros is extracted. In Step S64, with respect to the power units PU not belonging to any one of the blocks and macros, the respective chip power occupancy ratios CPR1 through CPR4 of the first wiring layer MET1 through the fourth wiring layer MET4 are acquired from the information storage section DM. In Step S65, since the resistance values of the power units PU not belonging to any one of the blocks and the macros are calculated, resistance modeling is carried out. In Step S66, the resistance values of the resistors RX1, RX2, RY1 and RY2 equipped in all the power units PU not belonging to any one of the blocks and the macros are obtained, and are stored in the power unit management table CT, and are established therein. For the detailed resistance modeling method, since the method is similar to the method for resistance modeling in the power units belonging to the blocks (step S41 through S45), detailed description thereof is omitted, wherein resistance modeling in Step S12 is finished, and the process advances to Step S13.

Figure 8:
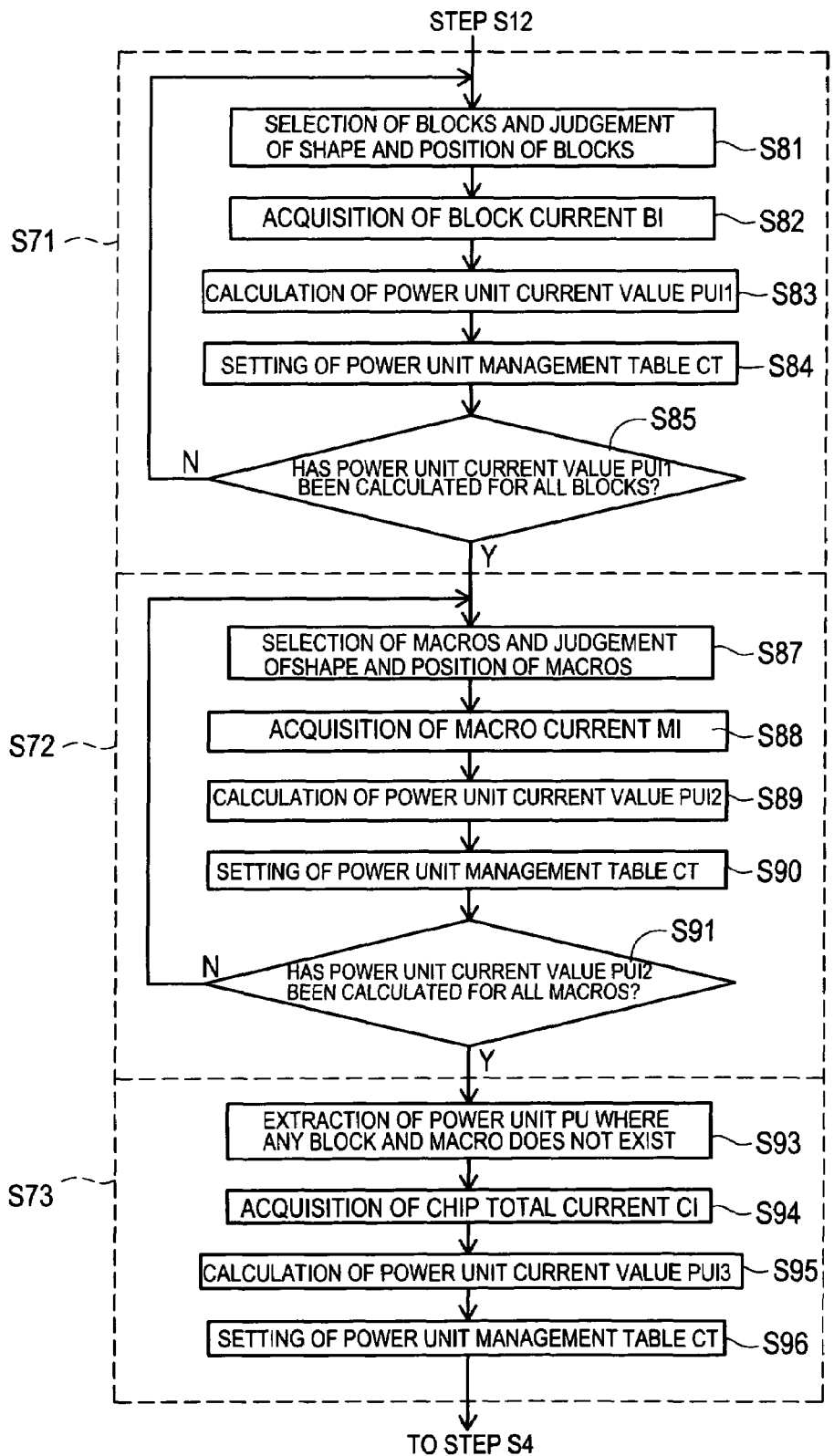
FIG. 8 is a flowchart depicting current source modeling in Step S13.

A flowchart of current source modeling in Step S13 is depicted in FIG. 8. The current source modeling is a method for modeling the current source PI in the power units PU (FIG. 3). The current source PI modeling in Step S13 is provided with Steps S71 through S73. Step S71 is a step for calculating the current value after extracting the power units PU that overlap the blocks BLK1 an d BLK2 in the core area CA. Step S72 is a step for calculating the current value after extracting the power units PU that overlap the macros MCR1 through MCR5 in the core area CA. Step S73 is a step for calculating the current value after extracting the power units PU that do not overlap any one of the blocks and the macros in the core area CA.

Step S71 is described below. Step S71 is provided with Steps S81 through S85. Step S81 selects blocks and judges the shape and position thereof. By selection of blocks, all the blocks disposed in the core area CA are selected one after another. As an example, first, block BLK1 is selected in FIG. 4. And, power units PU at least a part of which overlaps the block BLK1 are extracted with the shape and disposed position of the block BLK1 taken into consideration. In addition, the total number PUS1 of power units which is the total number of the extracted power units PU is obtained.

In Step S82, the block current BI corresponding to the block BLK1 is acquired from the information storage section DM. In Step S83, the power unit current value PUI1, which is a current value per power unit PU of the power units PU belonging to the block BLK1, is calculated. Herein, since it is modeled that the current values in the block are uniform, the power unit current value PUI1 is obtained by the following expression (7).

Power unit current value $PUI1$=(Block current $BI$)/
(Total number $PUS1$ of power units)   Expression (7).

And, in Step S84, the power unit current value PUI1 is stored in the power unit management table CT and managed therein. After that, the process advances to Step S85. With respect to all the blocks in the core area CA, it is judged whether or not calculation of the power unit current values PUI1 is carried out, wherein if the current value calculation is carried out for all the blocks (S85:y), the process advances to Step S72.

Step S72 is described below. Step S72 is provided with Steps S87 through S90. Step S87 selects macros and judges the shape and position thereof. In FIG. 4, first, macro MCR1 is selected, and a power unit PU at least a part of which overlaps the macro MCR1 is extracted. Also, the total number PUS2 of power units, which is the total number of the extracted power units, is obtained. In Step S88, the macro current MI corresponding to the macro MCR1 is acquired from the information storage section DM. In Step S89, the power unit current value PUI2, which is the current value per power unit PU of the power units PU belonging to the macro MCR1, is calculated by the following expression (8).

Power unit current value $PUI2$=(Macro current $MI$)/
(Total number $PUS2$ of power units)   Expression (8).

In Step S90, the power unit current value PUI2 is stored in the power unit management table CT and managed therein. After that, the process advances to Step S91, wherein it is judged whether or not the power unit current value PUI2 is calculated with respect to all the macros in the core area CA, and if the current value calculation is carried out for all the macros (S91:Y), the process advances to Step S73.

Step S73 is described below. Step S73 is provided with Steps S93 through S96. In Step S93, the power units PU not belonging to any one of the blocks and macros are extracted. Also, the total number PUS3 of power units, which is the total number of the extracted power units PU, is obtained. In Step S94, the chip total current CI being the current consumed in the entirety of a semiconductor chip is acquired from the information storage section DM. In Step S95, the power unit current value PUI3, which is the current value per power unit PU of the power units PU not belonging to any one of the blocks and the macros is calculated by the following expression (9).

Power unit current value $PUI3$=(Chip total current
$CI$−Block total current $TBI$−Macro total current
$TMI$)/(Total number $PUS3$ of power units)   Expression (9).

Herein, the block total current TBI is a totaled value of the block currents BI in all the blocks. Also, the macro total current TMI is a totaled value of the macro currents MI in all the macros.

In Step S96, the power unit current value PUI3 is stored in the power unit management table CT and managed therein. Thus, the current source PI modeling in Step S13 is finished.

Since, based on the above procedure, the resistance values and the power unit current values PUI1 through PUI3 are obtained with respect to all the power units PU in the layout area LA, the modeling of the power units PU in Step S3 is finished. And, the power unit management table CT is completed in line with termination of the modeling (Step S4).

In Step S5 (FIG. 1), using the power unit management table CT obtained in Step S4, the static IR drop is calculated by, for example, the method described in Patent Document (Japanese Unexamined Patent Application Publication No. 2003-233637).

Figure 9:
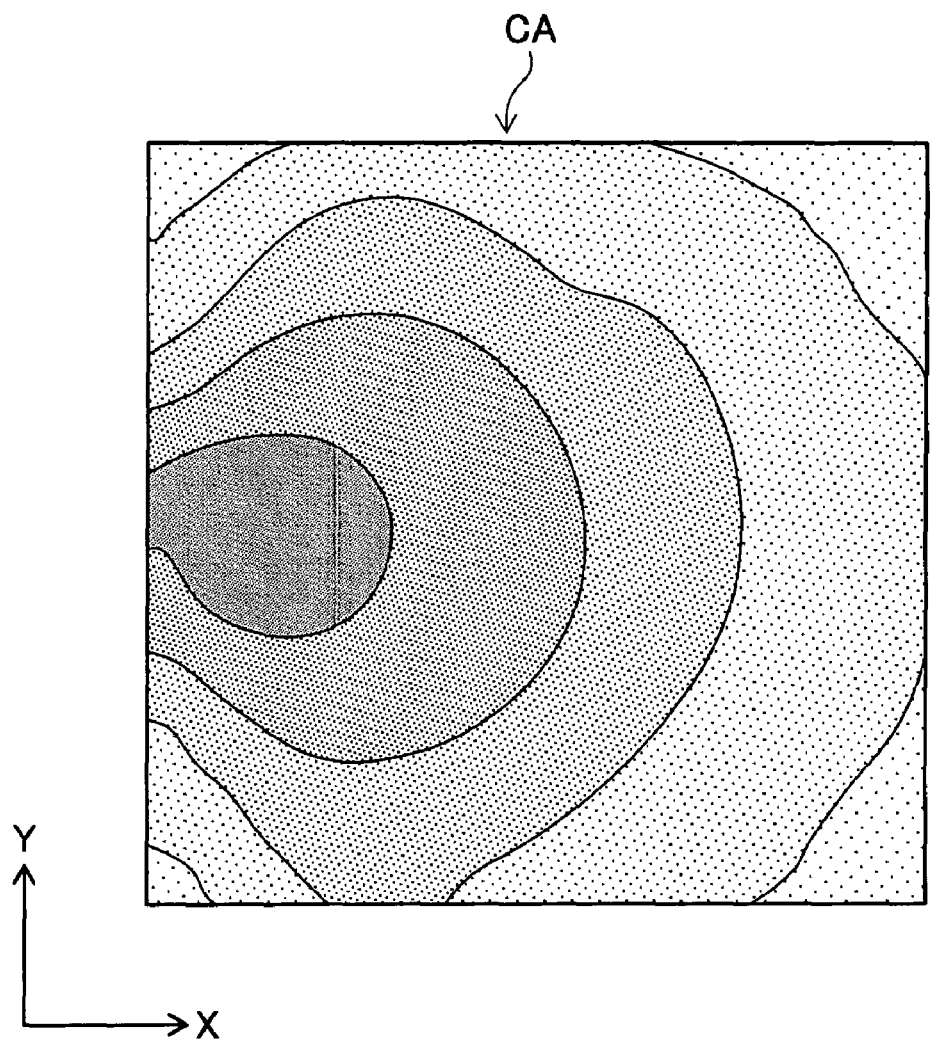
FIG. 9 is a view displaying the IR drop analysis result corresponding to FIG. 4.
Figure 9:
Figure 9:
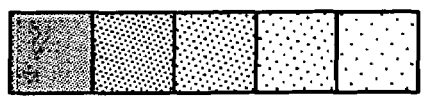

After the calculation is finished, the process advances to Step S6. The result of the IR drop analysis is displayed. FIG. 9 depicts display of the IR drop analysis result corresponding to the floor plan depicted in FIG. 4. As depicted in FIG. 9, it is understood that the voltage drop amount is increased at the left side middle part of a chip. This corresponds to the vicinity of the position where the macros MCR4 and MCR5 are disposed in the floor plan diagram of FIG. 4. That is, it is possible to take uneven distribution (unevenness) of blocks and macros in the floor plan into consideration for the IR drop estimation, and it is understood that a further highly accurate IR drop calculation is enabled.

In Step S7, it is judged whether or not the estimation amount of IR drop, which is obtained by the IR drop analysis, is within a standard value. In the present embodiment, as depicted in FIG. 9, the IR drop estimation amount at the left side middle part of a chip is large, and it is outside the standard value. It is considered that the cause is that arrangement of the macros MCR1 through MCR5 is centralized at the left side of the chip, and the power resource amount is short. Further, it is considered as a cause that the power I/O cell amount disposed at the chip left side is small, and a large consumption current value is assigned to the chip left side. Therefore, it is understood that it is preferable that the floor plan is changed so that the macros MCR1 through MCR5 are not centralized at the left side middle part of the core area CA. Accordingly, again returning to Steps S1 and S2 (S7:N), estimation of the IR drop amount is reviewed by feeding back the result of the IR drop analysis of FIG. 9. In addition, when returning to Step S1, it is necessary to change the design information, and when returning to Step S2, it is necessary to change only the floor plan.

Figure 10:
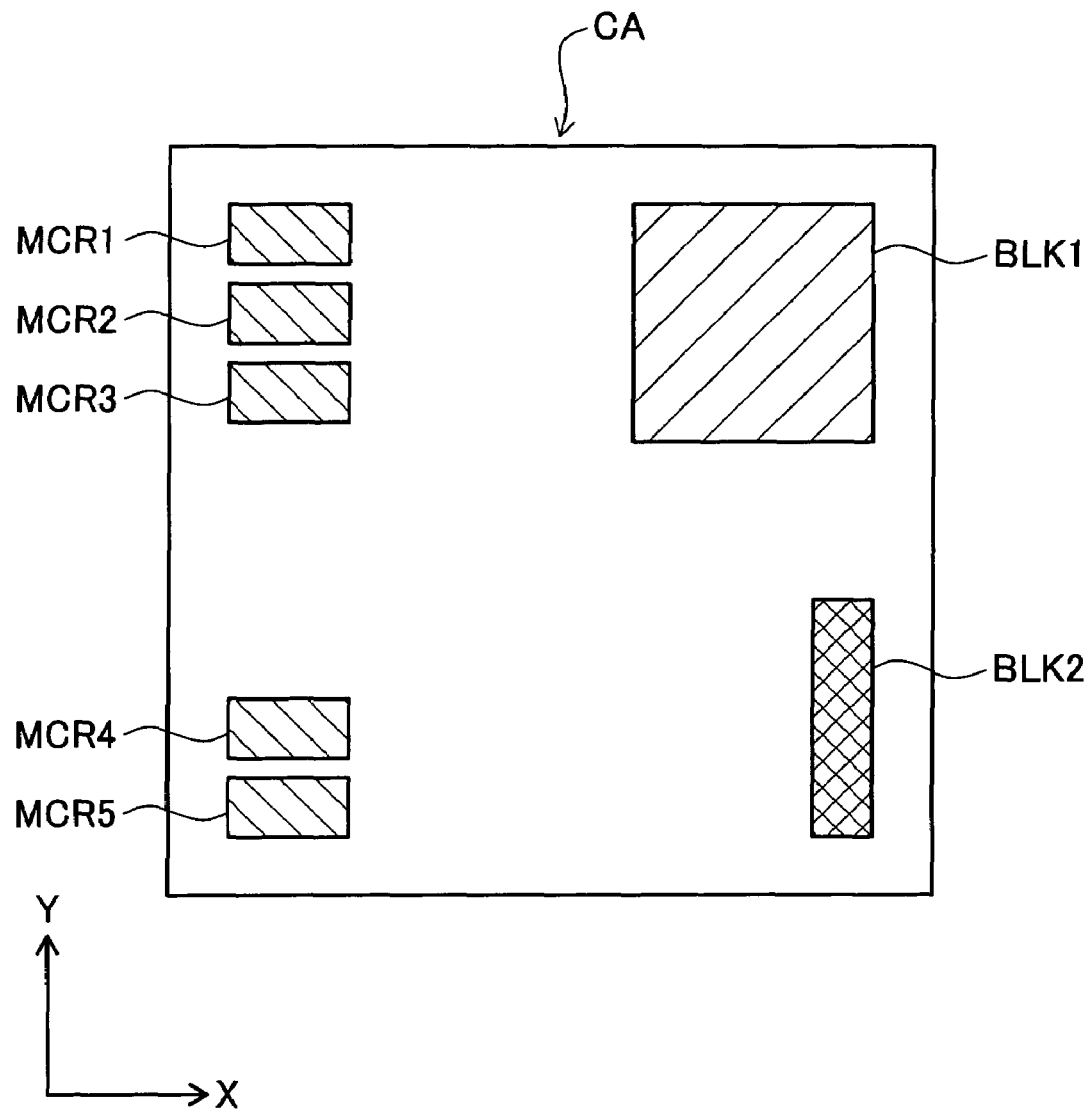
FIG. 10 is an arrangement view (after adjustment) of blocks and macro in the core area CA.
Figure 11:
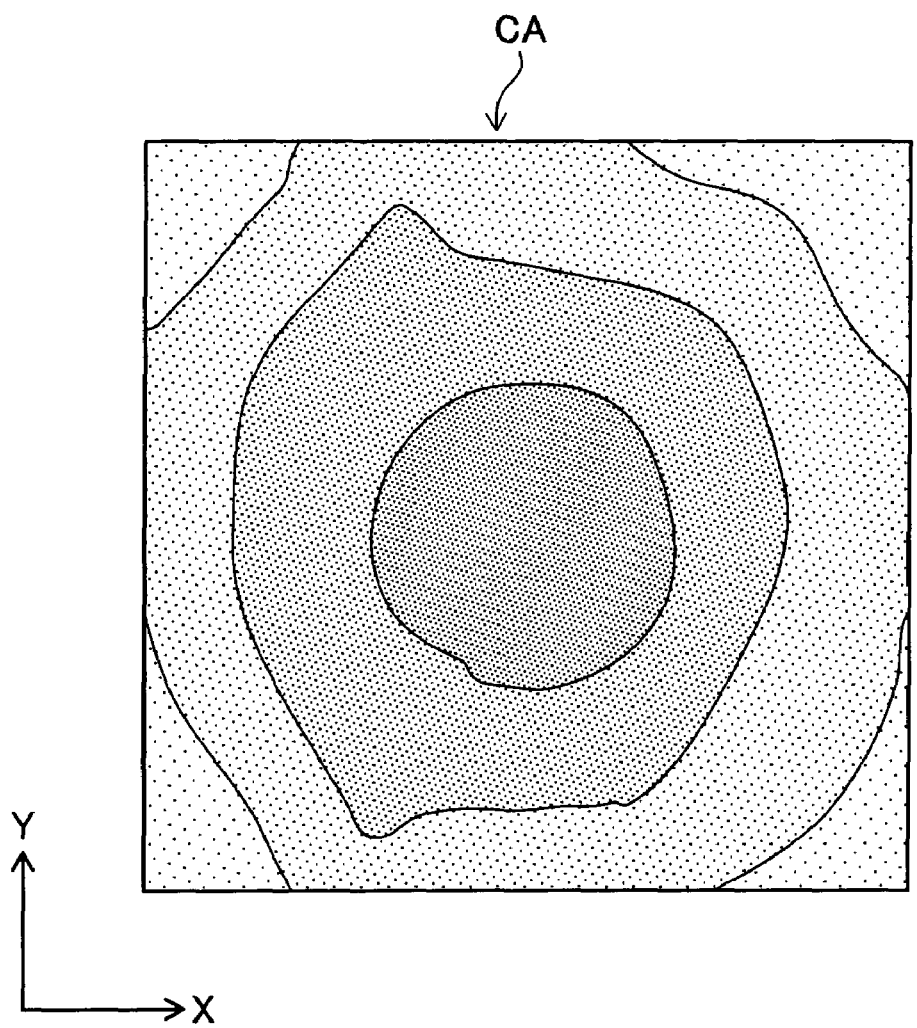
FIG. 11 is a view depicting the IR drop analysis result corresponding to FIG. 10.
Figure 11:
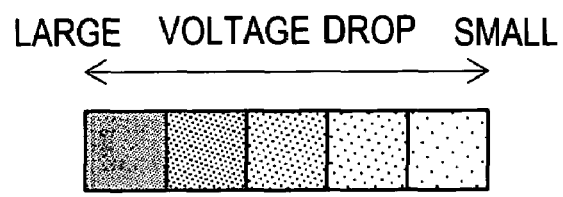
Figure 12:
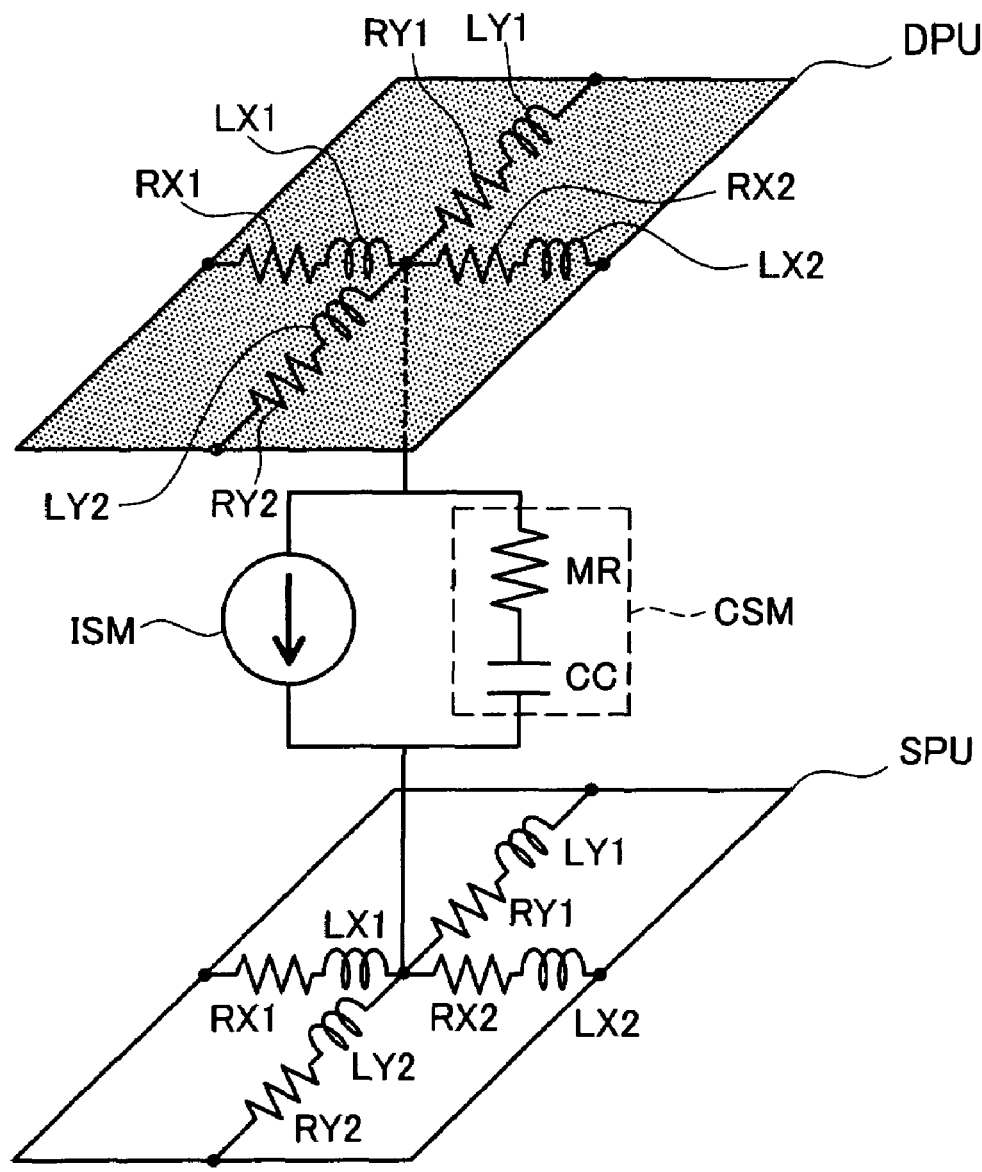
FIG. 12 is a model diagram depicting a power unit according to Embodiment 2.

An example in which the floor plan arrangement is re-adjusted in Step S2 is depicted in FIG. 10. Also, FIG. 11 depicts the result of the IR drop analysis corresponding to the floor plan of FIG. 10, which is obtained in Step S6. In FIG. 11, it is understood that uneven distribution of the IR drop amount to the left side of the core area CA has been solved, and the peak value of the drop amount has been lowered. Thus, the IR drop estimation amount falls in the standard value, wherein the initial estimation is finished (S7:Y). And the process advances to Step S8, wherein a physical design is carried out.

As described above, with the method for simulating power voltage drop of a semiconductor integrated circuit according to Embodiment 1, it is not necessary to use parameters such as various types of resistance values and current values when preparing a model of a power unit PU (FIG. 3) for simulation, wherein it is possible to use parameters (core size CS, power occupancy ratio, chip total current CI, power I/O position IOP, etc.), which are of higher-order concepts in terms of design with respect to the resistance values and current values. Therefore, it is possible to save time and effort of obtaining resistance values and current values when preparing a power unit PU model, wherein the time required for preparing the model can be shortened. Therefore, higher efficiency of the initial estimation simulation of static IR drop is enabled, and it becomes possible to attempt to shorten the period of development of a semiconductor integrated circuit.

Also, since model preparation efficiency can be increased by saving time and effort of giving resistance values and current values when preparing a model of power unit PU, it becomes possible to prepare models of a further number of power units PU in the same period of time as before. Thus, it is possible to make uneven distribution (unevenness) of various types of parameters such as resistance values and current values of power wiring into models in compliance with arrangement (floor plans) of various types of blocks and macros in the layout area LA. Therefore, since the accuracy of voltage drop simulation can be improved, it becomes possible to further accurately carry out the initial estimation of static IR drop.

Since core ring width CW, power I/O resistance value IOR and package resistance PR, which are of higher-order concepts in terms of design with respect to parameters such as resistance values and current values are acquired as design information, it is possible to reflect influences of these parameters into simulations in respective design of semiconductor integrated circuits. Therefore, the accuracy of the initial estimation of the static IR drop can be improved.

Further, as depicted in FIG. 4, with such an operation as disposing macros and blocks in the core area CA, it is possible to reflect uneven distribution (unevenness) in disposed position of macros and blocks into the initial estimation of the ID drop, wherein feed-back of the result of the IR drop analysis can be simplified and can highly efficiently be executed, and it is possible to shorten the period of development of semiconductor integrated circuits.

A description is given of Embodiment 2 according to the invention. Embodiment 2 pertains to a method for simulating instantaneous voltage fluctuations of a so-called dynamic drop. First, a description is given of a power unit model used for dynamic IR drop simulation according to the invention, using FIG. 12. The power unit for dynamic IR drop is provided with a power unit DPU for VDD wiring and a power unit SPU for VSS wiring. The power units DPU and SPU have a two-dimensional cross-shaped circuit model in which respective sides of a rectangle include four model inductors LX1, LX2, LY1 and LY2. In addition, an internal capacitance sub model CSM and an internal consumption current sub model ISM are prepared between the power units DPU and SPU. By, for example, the method according to Patent Document (Japanese Unexamined Patent Application Publication No. 2004-234618) using the power units, dynamic IR drop is calculated. Hereinafter, a description is given of a flow for carrying out modeling of a model inductor of the power unit and a flow for carrying out modeling of capacitor CC and resistor MR, which are included in the internal capacitance sub model CSM, using FIG. 1.

In Step S1 (design information input) of the flowchart of FIG. 1, in Embodiment 2, power I/O inductance IOL, package inductance PL and decoupling capacitance value DC are further inputted in a simulator. The information is stored in the information storage section DM. The power I/O inductance IOL is an inductance value which the power I/O cell has. The package inductance PL is the total of inductance values existing in the channel from the power I/O cell to the peripheral terminal of a package via wire bonding. Also, the decoupling capacitance value DC is decoupling capacitance that the entirety of a semiconductor integrated circuit has. In detail, the decoupling capacitance value DC is obtained by the total of the capacitance between power wirings, which exists in the internal plane expressed by the power units DPU and SPU, the capacitance of a decoupling capacitor for lowering power noise, and capacitance of a logic gate of internal circuits.

An inductor modeling step and a capacitance modeling step are additionally equipped between Step S13 (Current source modeling) and Step S4 (Setting of power unit management table CT) in the flowchart of FIG. 1.

The inductor modeling step is provided with a flow similar to the resistance modeling step (FIG. 5 and FIG. 6) of Step S12. And, in Steps S43, S48 and S52, sheet inductance values SL1 through SL4 are used instead of the sheet resistance values SR1 through SR4. Also, in Step S56, the inductance value IOL is acquired from the information storage section DM in addition to the power I/O resistance value IOR of the selected power I/O cell. Also, in Step S59, the package inductance PL is acquired from the information storage section DM in addition to the package resistance PR corresponding to the selected power I/O cell. Further, since the detailed inductance modeling method is similar to the resistance modeling method in Step S12, the description thereof is omitted.

On the other hand, the capacitance modeling step is a step for calculating the capacitance value of a capacitor CC equipped in the internal capacitance sub model CSM of the power unit PU belonging to the core area CA. In detail, the capacitance value of the capacitor CC can be obtained by dividing the decoupling capacitance value DC by the total number of power units PU belonging to the core area CA. In addition, since the detailed capacitance modeling method is similar to the current source modeling method of Step S13, the description thereof is omitted. Further, the power unit current values PUI1 through PUI3, which can be obtained by the current source modeling step (FIG. 8) of Step S13, are used for the current values of the internal consumption current sub model ISM. Also, the resistance value of the resistor MR of the internal capacitance sub model CSM can be disregarded because it is sufficiently small in comparison with the resistance value RX1 of the power unit.

As has been described above, with the method for simulating power voltage drop of a semiconductor integrated circuit according to Embodiment 2, when preparing a model of a power unit PU (FIG. 12) for simulation corresponding to an instantaneous voltage fluctuation of a so-called dynamic drop, it is not necessary to use parameters such as various types of inductance values and capacitance values, wherein parameters (decoupling capacitance value DC, sheet inductance value SL, core size CS and power occupancy ratio, etc.) of higher-order concepts in terms of design with respect to the inductance values and capacitance values may be used. Therefore, when preparing a power unit PU model, it is possible to save time and effort for obtaining the inductance values and capacitance values, wherein it is possible to shorten the time required for preparing a model and efficiency of the initial estimation simulation of the dynamic IR drop can be increased.

Also, since model preparing efficiency can be increased by saving time and effort of giving the inductance values and capacitance values when preparing a model of the power units PU, it becomes possible to prepare a greater number of models of power units PU for the same period of time as before. Thus, it becomes possible to make uneven distribution (unevenness) of various types of parameters such as inductance values, etc., of the power wiring into models in compliance with arrangement of various types of blocks and macros in the layout area LA. Therefore, it becomes possible to accurately analyze effects of capacitance components of lowering power noise in connection to an instantaneous voltage fluctuation of a so-called dynamic drop. Also, based on the result of analysis, it is possible to attempt to optimize the arrangement of decoupling capacitors.

In addition, the invention is not limited to the above-described embodiments, and it is a matter of course that the invention may be subjected to various improvements and modifications within the scope not departing from the spirit of the invention. In Embodiment 1, although uneven distribution (unevenness) of various types of parameters in the layout area LA is modeled with the block position, macro position and power I/O cell position in the layout area LA taken into consideration, the embodiment is not limited thereto. For example, by using power units PU, which are identical to each other, with the entire chip surface regarded as a uniform model, such a construction may be employed, in which the floor plan of blocks and macros is not taken into account.

In this case, the block shape BS, macro shape MS, block current BI, and macro current MI of the design information necessary to be inputted in Step S1 (FIG. 1) are no longer required. In addition, the core ring with CW and the power I/O resistance value IOR are fixed with a technology. Further, a value of the representative package based on a technology may be used as the package resistance PR. Accordingly, the parameters required for the design information may become only the chip uniform power occupancy ratio UPR, core size CS and chip total current CI, wherein necessary parameters may be simplified. In addition, the block position BP and the macro position MP of the floor plan information necessary to be inputted in Step S2 are no longer required. Therefore, the parameter necessary as the floor plan information may be simplified to be the power I/O position IOP.

In this case, in order to obtain the model resistances RX1, RX2, RY1 and RY2 in the model (FIG. 3) of the power units PU, calculations are executed in Step S12, using the chip uniform power occupancy ratio UPR. Also, in order to obtain the power unit current value PUI, in Step S13, the core size CS is divided by the power unit size US acquired from the library, thereby obtaining the total number PUS4 of power units, which is the total number of power units PU occupying the core area CA. And, by uniformly allotting the chip total current CI to the total number PUS4 of power units, the power unit current value PUI is obtained. Therefore, since it is possible to decrease the design information and floor plan information, which are necessary for a simulation, and to reduce the number of models of the power units PU, it is possible to further shorten the time required for preparing models. Accordingly, further higher efficiency is enabled for the initial estimation simulation of the static IR drop, wherein the period of development of a semiconductor integrated circuit can further be shortened.

In Embodiment 2, power units PU, which are identical to each other, are used with the entire chip surface regarded as a uniform model, wherein the floor plan of blocks and macros may no longer be taken into account. In this case, the parameter necessary as the design information is a decoupling capacitance value DC in addition to the chip uniform power occupancy ratio UPR, core size CS and chip total current CI. Also, the parameter necessary as the floor plan information is the power I/O position IOP. Therefore, in Embodiment 2, since it is possible to reduce the design information and the floor plan information, which are required for the dynamic IR drop simulation, and to reduce the number of models of power units PU, the time required for preparing models can further be shortened.

Also, although the power unit PU at least a part of which overlaps a block and a macro is recognized as a power unit PU belonging to the corresponding block and macro, the invention is not limited thereto. The ratio at which a power unit PU overlaps a block and a macro is obtained, and resistance modeling and current source modeling may be carried out as a power unit belonging to the block and macro in response to the ratio. For example, where the half area of a power unit PU overlaps the block BLK1, the corresponding power unit PU is regarded as one attributed to the block BLK1 by 50%, wherein the resistance value and the current value may be obtained in compliance with the ratio of attribution. Therefore, since uneven distribution of various types of parameters in the layout area LA can be made into highly accurate models, it is possible to further improve the accuracy of the initial estimation simulation of the IR drop.

In addition, the embodiments are such that estimation at the initial stage of design is enabled without use of category data such as a net list, etc., the embodiments are not limited thereto. Where a net list already exists, it is a matter of course that design entry work can be simplified by bringing in the net list, and a flexible operation is enabled.

Furthermore, a power unit PU is an example of a division unit. Blocks BLK1 through BLK2 and macros MCR1 through MCR5 are examples of a circuit aggregate. Block shape BS and macro shape MS are examples of information regarding the circuit aggregate shape. Block current BI and macro current MI are examples of information of circuit aggregate current amount, respectively.

According to the invention, when preparing models of division units for a power voltage distribution simulation, it is possible to prepare models by using parameters (power occupancy ratio information, power I/O position information, etc.) of higher-order concepts in terms of design with respect to the resistance value and current value. Therefore, when preparing models of division units, time and effort for obtaining the resistance values and current values can be saved, wherein it is possible to attempt to shorten the time required for preparing models, and higher efficiency is brought about in the simulation. In addition, it becomes possible to handle a greater number of division units in line with improvement of the model preparing efficiency, wherein the accuracy of voltage drop simulation can be improved.

What is claimed is:

1. A method for simulating a power voltage distribution, comprising the steps of:

dividing a layout area of a semiconductor integrated circuit into a plurality of division units and acquiring power occupancy ratio information that expresses a power wiring density in the division units;

acquiring power I/O position information, which expresses at least one position to which power is fed in the layout area;

obtaining a resistance value of a model resistor, which expresses the resistance value of power wiring between the division units adjacent to each other, in response to a predetermined sheet resistance value of the power wiring and the power occupancy ratio information; and defining a division unit at least a part of which overlaps a predetermined area disposed by at least one so that the predetermined area occupies at least a part of the layout area as a division unit belonging to the predetermined area, and uniformly allotting a consumption current consumed in the predetermined area to the division units belonging to the predetermined area.

2. The method for simulating a power voltage distribution according to claim 1, comprising the steps of:

acquiring core size information that expresses the size of the core area, in which circuits pertaining to main actions are disposed, in the layout area; and acquiring information of chip total current, which is a current consumed in the entire semiconductor integrated circuit, as a consumption current consumed in the predetermined area;

wherein the core area is employed as the predetermined area; the number of division units of the core area, which is the total number of the division units occupying the core area, is obtained by dividing the core size information by information of the predetermined division unit size expressing the size of the division units; and the obtained number of division units of the core area is used as the number of the division units belonging to the predetermined area.

3. A method for simulating a power voltage distribution, which is provided with a plurality of types of circuit aggregates composed of a combination of a plurality of circuits, having the circuit aggregates disposed in a core area, in which circuits pertaining to main actions are disposed, in the layout area, comprising the steps of:

acquiring information of circuit aggregate positions expressing positions of the circuit aggregates disposed in the core area;

acquiring information of circuit aggregate shapes expressing the shapes of the circuit aggregates;

acquiring information of circuit aggregate current amounts expressing a current consumed by the corresponding circuit aggregate in compliance with the type of the circuit aggregate;

acquiring information of chip total current being a current consumed by the entirety of the semiconductor integrated circuit;

calculating an area occupied by circuit aggregates, at which the respective circuit aggregates exist on the core area, based on the information of circuit aggregate positions and the information of circuit aggregate shapes, and extracting the number of the division units belonging to the area occupied by the circuit aggregates for each of the circuit aggregates; and obtaining a resistance value of the model resistor based on the power occupancy ratio information and the sheet resistance value, which are determined in compliance with a type of the circuit aggregate to which the division units belong;

wherein the consumption current value in the division units belonging to the area occupied by the circuit aggregates is obtained by dividing the current value of the information of the circuit aggregate current amount by the number of the division units belonging to the area occupied by the circuit aggregates; and the consumption current amount in the division units not belonging to the area occupied by the circuit aggregates is obtained by dividing the remaining value, which is obtained by subtracting the totaled value of the information of the circuit aggregate current amounts for all the circuit aggregates from the chip total current information, by the number of the division units not belonging to any area occupied by the circuit aggregates.

4. The method for simulating a power voltage distribution according to claim 3, wherein the semiconductor integrated circuit includes a multilayered wiring structure having a plurality of wiring layers of the power wiring; and the power occupancy ratio information is determined for each of the wiring layers.

5. The method for simulating a power voltage distribution according to claim 1, further comprising the step of:

acquiring core ring width information expressing the width of a core ring which is power wiring annularly disposed in the surrounding of a core area, in which circuits pertaining to main actions are disposed, in the layout area;

wherein a resistance value of the model resistor of the division units belonging to the core ring is obtained based on the sheet resistance value and the core ring width information.

6. The method for simulating a power voltage distribution according to claim 1, further comprising the step of:

acquiring power I/O resistance information expressing the resistance value held by power I/O cells being at least one or more cells for feeding power to the layout area.

7. The method for simulating a power voltage distribution according to claim 1, further comprising the step of:

acquiring package resistance information expressing a resistance value existing in a connection channel between at least one or more power I/O cells being cells for feeding power to the layout area and a peripheral connection terminal of a package of the semiconductor integrated circuit.

8. The method for simulating a power voltage distribution according to claim 1, which is a method for simulating power voltage, by which the division units prepared for each of the different types of power are connected by an internal circuit model, and a dynamic voltage distribution of a semiconductor integrated circuit is obtained, the same method comprising the steps of:

acquiring decoupling capacitance information expressing the decoupling capacitance equipped in the predetermined area; and wherein the decoupling capacitance information is uniformly allotted to the division units belonging to the predetermined area; and the resistance value of power wiring between the division units adjacent to each other is expressed by at least one or more model inductor, and the inductance value of the model inductor is obtained based on the predetermined sheet inductance value of the power wiring and the power occupancy ratio information thereof.

9. The method for simulating a power voltage distribution according to claim 8, comprising the steps of:
acquiring core size information that expresses the size of the core area, in which circuits pertaining to main actions are disposed, in the layout area; and
acquiring information of chip total current, which is a current consumed in the entire semiconductor integrated circuit, as a consumption current consumed in the predetermined area;
wherein the core area is employed as the predetermined area; the number of division units of the core area, which is the total number of the division units occupying the core area, is obtained by dividing the core size information by information of the predetermined division unit size expressing the size of the division units; and the obtained number of division units of the core area is used as the number of the division units belonging to the predetermined area.

10. A program embodied in a computer-readable medium for simulating a power voltage distribution, comprising the steps of:
dividing a layout area of a semiconductor integrated circuit into a plurality of division units and acquiring power occupancy ratio information that expresses a power wiring density in the division units;
acquiring power I/O position information, which expresses at least one position to which power is fed in the layout area;
obtaining a resistance value of a model resistor, which expresses the resistance value of power wiring between the division units adjacent to each other, in response to a predetermined sheet resistance value of the power wiring and the power occupancy ratio information;
defining a division unit at least a part of which overlaps a predetermined area disposed by at least one so that the predetermined area occupies at least a part of the layout area as a division unit belonging to the predetermined area, and uniformly allotting a consumption current consumed in the predetermined area to the division units belonging to the predetermined area.

* * * * *